(12) United States Patent
Wu

(10) Patent No.: US 10,726,240 B2
(45) Date of Patent: Jul. 28, 2020

(54) IMAGE CAPTURING APPARATUS

(71) Applicant: Gingy Technology Inc., Hsinchu (TW)

(72) Inventor: Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 16/689,099

(22) Filed: Nov. 20, 2019

(65) Prior Publication Data

US 2020/0089927 A1 Mar. 19, 2020

Related U.S. Application Data

(63) Continuation-in-part of application No. 16/261,184, filed on Jan. 29, 2019, which is a continuation-in-part of application No. 15/960,518, filed on Apr. 23, 2018, now Pat. No. 10,489,631, which is a continuation-in-part of application No. 15/662,238, filed on Jul. 27, 2017, now Pat. No. 10,002,281, which is a continuation-in-part of application No. 14/973,686, filed on Dec. 17, 2015, now Pat. No. 9,754,150, said application No. 16/261,184 is a (Continued)

(30) Foreign Application Priority Data

Oct. 19, 2015 (TW) .............................. 104134209 A
Mar. 17, 2017 (CN) ..................... 2017 2 0260844 U
Feb. 1, 2018 (CN) ..................... 2018 2 0172161 U

(51) Int. Cl.
*G06K 9/00* (2006.01)
*H01L 27/32* (2006.01)
*F21V 8/00* (2006.01)

(52) U.S. Cl.
CPC ......... *G06K 9/0004* (2013.01); *G02B 6/0035* (2013.01); *G02B 6/0055* (2013.01); *H01L 27/3227* (2013.01)

(58) Field of Classification Search
None
See application file for complete search history.

(56) References Cited

U.S. PATENT DOCUMENTS

| 8,917,387 B1* | 12/2014 | Lee | ...................... | G06K 9/0004 |
| | | | | 356/71 |
| 9,501,686 B2* | 11/2016 | Lin | ...................... | G06K 9/0004 |
| 10,147,757 B2* | 12/2018 | Lee | ...................... | G06K 9/0004 |

(Continued)

Primary Examiner — Andrae S Allison
(74) Attorney, Agent, or Firm — JCIPRNET

(57) ABSTRACT

An image capturing apparatus includes a light guide plate, a first light transmissive layer, a second light transmissive layer, a third light transmissive layer, a light source and an image capturing device. The light guide plate has a first surface and a second surface opposite to the first surface. The first light transmissive layer is disposed on the first surface. The second light transmissive layer is disposed on the second surface, wherein the second light transmissive layer is overlapped with a light transfer region of the light guide plate and not overlapped with a light penetration region of the light guide plate. The third light transmissive layer is disposed on the second surface and overlapped with the light transfer region and the light penetration region. Refractive indices of the third light transmissive layer and the light guide plate are higher than those of the first and second light transmissive layers.

21 Claims, 16 Drawing Sheets

Related U.S. Application Data continuation-in-part of application No. 15/588,700, filed on May 8, 2017, now Pat. No. 10,455,129.

(60) Provisional application No. 62/839,770, filed on Apr. 28, 2019, provisional application No. 62/867,213, filed on Jun. 26, 2019, provisional application No. 62/190,267, filed on Jul. 9, 2015, provisional application No. 62/563,045, filed on Sep. 25, 2017, provisional application No. 62/574,222, filed on Oct. 19, 2017, provisional application No. 62/413,974, filed on Oct. 27, 2016, provisional application No. 62/371,230, filed on Aug. 5, 2016.

(56) References Cited

U.S. PATENT DOCUMENTS

| | | | |
|---|---|---|---|
| 10,288,934 B2 | 5/2019 | Yoon et al. | |
| 10,331,939 B2* | 6/2019 | He | G06K 9/0012 |
| 10,339,359 B2* | 7/2019 | Zhang | H01L 51/0097 |
| 2015/0212250 A1* | 7/2015 | Tai | G02B 6/0031 |
| | | | 362/609 |
| 2016/0041323 A1* | 2/2016 | Ma | G03H 1/0465 |
| | | | 359/15 |
| 2016/0224816 A1* | 8/2016 | Smith | G02B 27/58 |
| 2016/0247010 A1* | 8/2016 | Huang | G02B 5/20 |
| 2016/0266695 A1* | 9/2016 | Bae | G06F 1/1643 |
| 2017/0270342 A1* | 9/2017 | He | G06F 3/042 |
| 2017/0315293 A1* | 11/2017 | Bang | G02B 6/102 |
| 2018/0005003 A1 | 1/2018 | Ryu et al. | |
| 2019/0065816 A1* | 2/2019 | Reinhold | G02B 6/0061 |

\* cited by examiner

IMAGE CAPTURING APPARATUS

CROSS-REFERENCE TO RELATED APPLICATION

This application is a continuation-in-part application of and claims the priority benefit of U.S. application Ser. No. 16/261,184, filed on Jan. 29, 2019, now pending. This application also claims the priority benefits of U.S. provisional application Ser. No. 62/839,770, filed on Apr. 28, 2019 and U.S. provisional application Ser. No. 62/867,213, filed on Jun. 26, 2019. The entirety of each of the above-mentioned patent applications is hereby incorporated by reference herein and made a part of this specification.

BACKGROUND OF THE INVENTION

Field of the Invention

The disclosure relates to an electronic device, and more particularly to an image capturing apparatus.

Description of Related Art

Types of biometric identification include identification of faces, voices, iris, retina patterns, veins, palm prints and fingerprints. According to different detection methods, biometric identification apparatuses may be categorized into optical, capacitive, ultrasonic and thermal types. In general, an optical biometric identification apparatus includes a light source, a light guide element and an image capturing device. Light beams emitted by the light source radiates on an object that is pressed on the light guide element. The image capturing device receives the light beams reflected by the object to identify the biological characteristics. During the process of capturing images by the image capturing device, the light beams reflected by the object tend to be transmitted to the image capturing device in a disorganized manner, leading to the captured images of poor quality and influencing the result of identification. Despite some technologies aimed at improving the quality of the captured images, it is still difficult to address the problem of crosstalk effectively through advances in the current technology.

SUMMARY OF THE INVENTION

The disclosure provides an image capturing apparatus having a good identification capability.

In an exemplary embodiment, an image capturing apparatus includes a light guide plate, a first light transmissive layer, a second light transmissive layer, a third light transmissive layer, a light source and an image capturing device. The light guide plate has a first surface, a second surface opposite to the first surface and a plurality of third surfaces each connecting the first surface to the second surface. The first light transmissive layer is disposed on the first surface. The second light transmissive layer is disposed on the second surface, wherein the second light transmissive layer is overlapped with a light transfer region of the light guide plate in a normal direction of the light guide plate, and the second light transmissive layer is not overlapped with a light penetration region of the light guide plate in the normal direction. The third light transmissive layer is disposed on the second surface and overlapped with the light transfer region and the light penetration region in the normal direction. A refractive index of the third light transmissive layer is higher than a refractive index of the first light transmissive layer and a refractive index of the second light transmissive layer, and a refractive index of the light guide plate is higher than the refractive index of the first light transmissive layer and the refractive index of the second light transmissive layer. The light source is located below the first surface or beside one of the third surfaces. The image capturing device is located below the first surface.

In view of the above, by providing two light transmissive layers (such as the first light transmissive layer and the second light transmissive layer) having lower refractive indices on both sides of the light guide plate, most of the light beams can be transmitted through total internal reflection in the light guide plate. In addition, by the design that the second light transmissive layer is not overlapped with the light penetration region and the third light transmissive layer is overlapped with the light penetration region, the light beams transmitted in the light guiding plate can be transmitted to the surface of the third light transmissive layer pressed by the object, and the light beams reflected by the object can be returned to the light guide plate after passing through the third light transmissive layer and then transmitted to the image capturing device through total internal reflection. Therefore, stray light beams received by the image capturing device can be reduced and the image capturing apparatus has a good identification capability.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
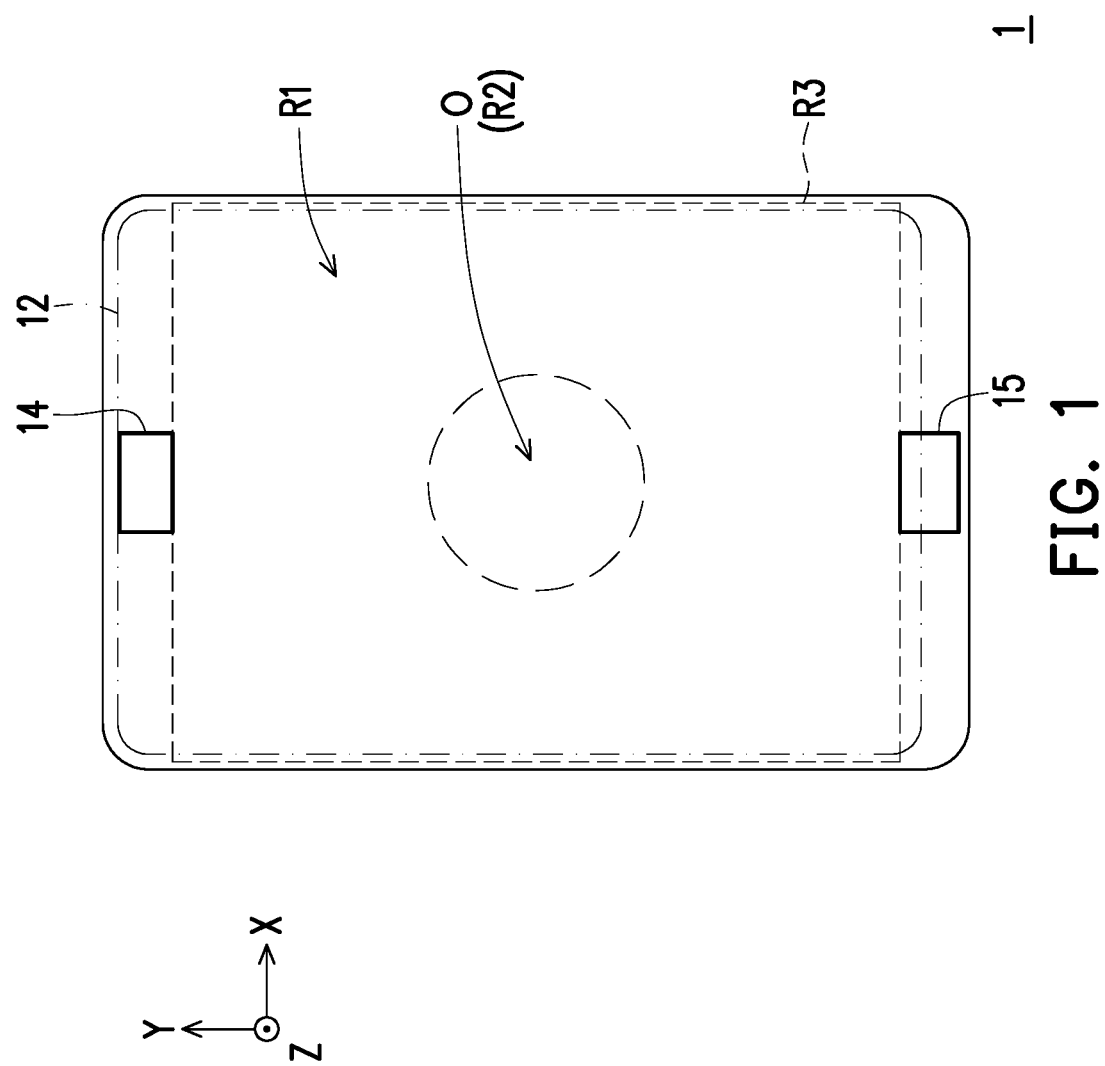
FIG. 1 is a schematic top view of an image capture apparatus according to a first exemplary embodiment of the disclosure.

In the following exemplary embodiments, wordings used to indicate directions, such as "up," "down," "front," "back," "left," and "right," merely refer to directions in the accompanying drawings. Therefore, the directional wordings are used to illustrate rather than limit the disclosure. In addition, when a layer/element (e.g. a first layer/element) is described to be disposed on another layer/element (e.g. a second layer/element), the first layer/element may be directly disposed on the second layer/element with no additional layer(s)/element(s) disposed therebetween; alternatively, the first layer/element may be disposed on the second layer/element with additional layer(s)/element(s) disposed therebetween.

In the accompanying drawings, the drawings illustrate the general features of the methods, structures, and/or materials used in the particular exemplary embodiments. However, the drawings shall not be interpreted as defining or limiting the scope or nature covered by the exemplary embodiments. For example, the relative size, thickness and location of layers, regions, and/or structures may be reduced or enlarged for clarity.

In the exemplary embodiments, the same or similar elements will be designated by the same or similar reference numerals, and descriptions thereof will be omitted. In addition, the features of different exemplary embodiments may be combined with each other when they are not in conflict, and simple equivalent changes and modifications made according to the specification or the claims are still within the scope of the disclosure. In addition, the terms such as "first" and "second" mentioned in the specification or the claims are only used to name discrete elements or to distinguish different exemplary embodiments or scopes and are not intended to limit the upper or lower limit of the number of the elements, nor are they intended to limit the manufacturing order or disposition order of the elements.

In the exemplary embodiments of the disclosure, each of the image capturing apparatuses is adapted to capture biological features of an object. The object may be a finger, a palm, a wrist or an eyeball of a user, and the corresponding biological features may be fingerprints, palm prints, veins, pupils or irises, etc., but the disclosure is not limited thereto. In the following exemplary embodiments, a finger is taken as an example of the object to further illustrate the disclosure.

Figure 2:
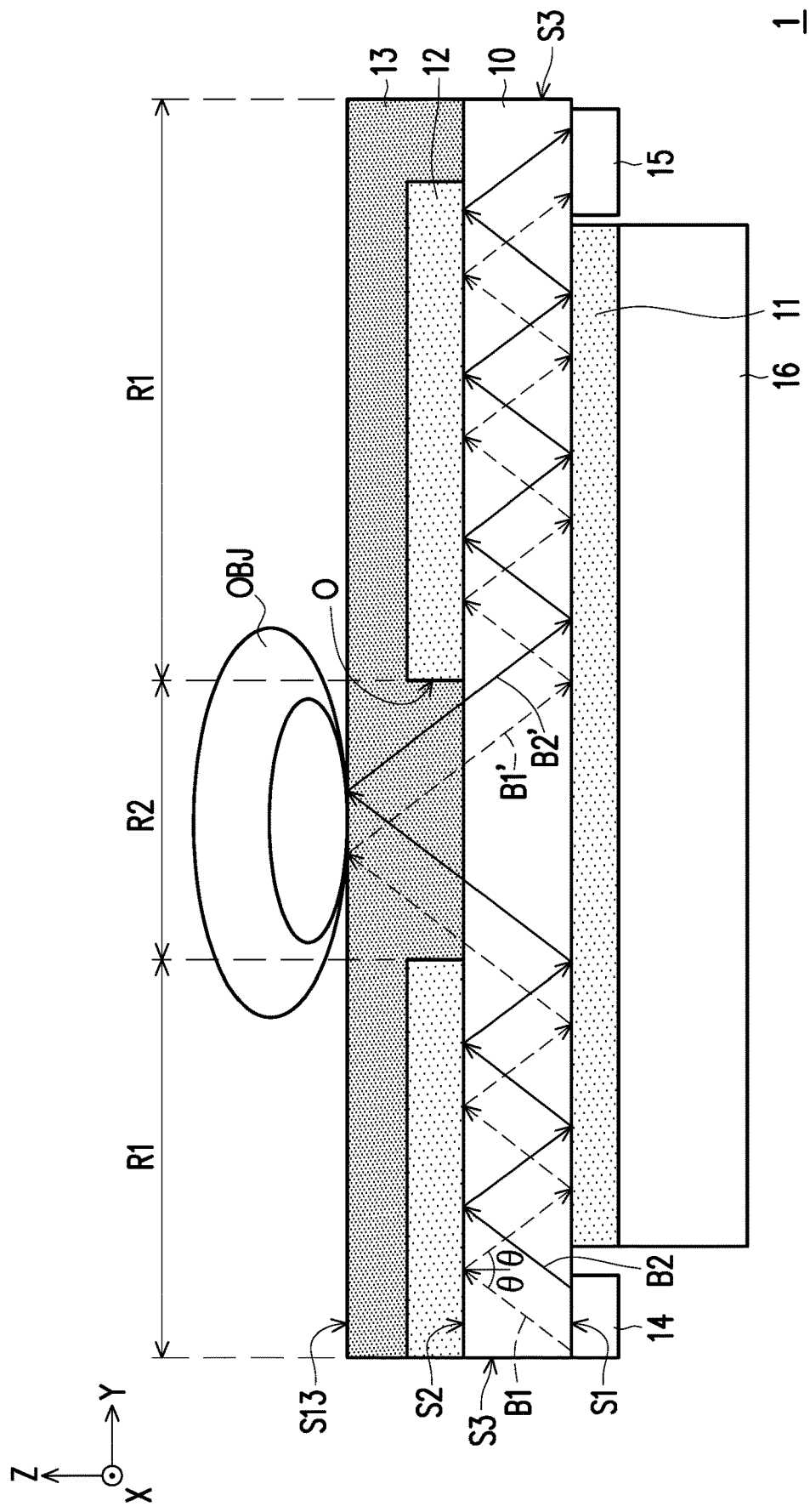
FIG. 2 is a schematic partial sectional view of the image capture apparatus according to the first exemplary embodiment of the disclosure.

FIG. 1 is a schematic top view of an image capture apparatus 1 according to a first exemplary embodiment of the disclosure. FIG. 2 is a schematic partial sectional view of the image capture apparatus 1 according to the first exemplary embodiment of the disclosure.

Referring to FIG. 1, the image capturing apparatus 1 of the first exemplary embodiment includes a light guide plate 10, a first light transmissive layer 11, a second light transmissive layer 12, a third light transmissive layer 13, a light source 14 and an image capturing device 15.

The light guide plate 10 is adapted to transmit (transfer) light beams, and the light beams may be transmitted (transferred) therein in a total internal reflection (TIR) way. The light guide plate 10 may be transparent to reduce the loss of light beams transmitted therein, but the transmittance of the light guide plate 10 (the percentage of light beams passing through the light guide plate 10) is not limited to 100%. For example, the light guide plate 10 may be a glass light guide plate, a plastic light guide plate or a combination of the above, but not limited thereto.

The light guide plate 10 has a first surface S1, a second surface S2 opposite to the first surface S1 and a plurality of third surfaces S3 each connecting the first surface S1 to the second surface S2. As shown in FIG. 2, the first surface S1 may be a bottom surface of the light guide plate 10, and the first surface S1 faces away from an object OBJ to be identified. The second surface S2 may be a top surface of the light guide plate 10, and the second surface S2 faces the object OBJ. The third surfaces S3 may be side surfaces of the light guide plate 10, and the third surfaces S3 are located between the first surface S1 and the second surface S2.

The light guide plate 10 has a light transfer region R1 and a light penetration region R2. The light transfer region R1 is a region where light beams are transmitted within the light guide plate 10 through total internal reflection. The light penetration region R2 is a region where light beams output from the light guide plate 10 and transmitted to the object OBJ. Namely, the light penetration region R2 corresponds to a region, which is pressed by the object OBJ, of the image capturing apparatus 1 to perform biometric identification. In the exemplary embodiment, the light transfer region R1 surrounds the light penetration region R2, but the disposition relationship between the light transfer region R1 and the light penetration region R2 is not limited thereto.

The first light transmissive layer 11 is disposed on the first surface S1. In the exemplary embodiment, the first light transmissive layer 11 may be, for example, a continuous transmission layer, but not limited thereto. Moreover, the first light transmissive layer 11 is overlapped with the light transfer region R1 and the light penetration region R2 in a normal direction Z of the light guide plate 10, but not limited thereto.

The first light transmissive layer 11 is transparent, but the transmittance thereof is not limited to 100%. For example, the first light transmissive layer 11 may be made of fluorine-containing materials or silicon-containing materials, but not limited thereto.

The second light transmissive layer 12 is disposed on the second surface S2. The second light transmissive layer 12 is overlapped with the light transfer region R1 in the normal direction Z, and the second light transmissive layer 12 is not overlapped with the light penetration region R2 in the normal direction Z. Namely, the light transfer region R1 is at least partially covered by the second light transmissive layer 12, and the light penetration region R2 is at least partially not covered by the second light transmissive layer 12. For example, the second light transmissive layer 12 may have an opening O overlapped with the light penetration region R2 in the normal direction Z, but not limited thereto. A shape of the opening O (or the light penetration region R2) may be a circle, a quadrangle or other suitable shape.

The second light transmissive layer 12 is transparent, but the transmittance thereof is not limited to 100%. For example, the second light transmissive layer 12 may be made of fluorine-containing materials or silicon-containing materials, but not limited thereto. Moreover, materials of the first light transmissive layer 11 and the second light transmissive layer 12 may be the same or different.

The third light transmissive layer 13 is disposed on the second surface S2 and overlapped with the light transfer region R1 and the light penetration region R2 in the normal direction Z. For example, the third light transmissive layer 13 may be disposed on the second light transmissive layer 12 and the light guide plate 10 not covered by the second light transmissive layer 12, so that the second light transmissive layer 12 is located between the third light transmissive layer 13 and the light guide plate 10, and a portion of the third light transmissive layer 13 is located in the opening O, but the disposition relationship between the second light transmissive layer 12 and the third light transmissive layer 13 is not limited thereto.

The third light transmissive layer 13 is transparent, but the transmittance thereof is not limited to 100%. For example, the second light transmissive layer 12 may be made of acrylic, epoxy or optical clear adhesive (OCA), but not limited thereto.

A refractive index n13 of the third light transmissive layer 13 is higher than a refractive index n11 of the first light transmissive layer 11 and a refractive index n12 of the second light transmissive layer 12, and a refractive index n10 of the light guide plate 10 is higher than the refractive index n11 of the first light transmissive layer 11 and the refractive index n12 of the second light transmissive layer 12. For example, the refractive index n11 of the first light transmissive layer 11 is larger than 1 and smaller than or equal to 1.45 (i.e. $1<n11\leq1.45$), the refractive index n12 of the second light transmissive layer 12 is larger than 1 and smaller than or equal to 1.45 (i.e. $1<n12\leq1.45$), the refractive index n13 of the third light transmissive layer 13 is larger than or equal to 1.5 (i.e. $1.5\leq n13$), and the refractive index n10 of the light guide plate 10 is larger than or equal to 1.5 (i.e. $1.5\leq n10$).

In an exemplary embodiment, a refractive index difference (e.g. n10 minus n11) between the light guide plate 10 and the first light transmissive layer 11 may be larger than 0.05 and a refractive index difference (e.g. n10 minus n12) between the light guide plate 10 and the second light transmissive layer 12 may be larger than 0.05 to facilitate the formation of total internal reflection.

The refractive index n13 of the third light transmissive layer 13 may be higher than or equal to the refractive index n10 of the light guide plate 10. As such, interface reflection at the interface between the light guide plate 10 and the third light transmissive layer 13 and the visibility of the opening O may be reduced, and light beams transmitted from the light transfer region R1 to the light penetration region R2 may be output from the light guide plate 10 and transmitted to the object OBJ, and the light beam reflected by the object OBJ may enter the light guide plate 10 and be transmitted to the image capturing device 15 through total internal reflection. In an exemplary embodiment, a refractive index difference (e.g. n13 minus n10) between the light guide plate 10 and the third light transmissive layer 13 may be smaller than 0.1.

The light source 14 is located below the first surface S1 or beside one of the third surfaces S3. In the exemplary embodiment, the light source 14 is located below the first surface S1 and beside the first light transmissive layer 11, but not limited thereto. In an exemplary embodiment, the first surface S1 may have a notch (not shown) at the light entrance side, and the light source 14 may be disposed in the notch. Under such configuration, the first surface S1 has a height difference between the portion overlapping the light source 14 and the portion not overlapping the light source 14, and the height difference may be approximate to the thickness of the light source 14, but not limited thereto.

The light source 14 is adapted to emit light beams (such as light beams B1 and B2) for biometric identification. For example, the light source 14 may be a visible light source or a non-visible light source. The non-visible light source may be an infrared light source, but not limited thereto. The light source 14 may include one or more light emitting elements, such as one or more light emitting diodes, and the light emitting elements may be arranged along a direction X perpendicular to the normal direction Z, but not limited thereto.

The image capturing device 15 is located below the first surface S1. For example, the image capturing device 15 is located beside the first light transmissive layer 11, and the light source 14 and the image capturing device 15 are located at opposite sides of the light guide plate 10, but not limited thereto. The image capturing device 15 may be adhered to the light guide plate 10 through an adhesive (not shown), but not limited thereto. The adhesive may be an OCA (Optical Clear Adhesive) or OCR (Optical Clear Resin), but not limited thereto. In an exemplary embodiment, the first surface S1 may have a notch (not shown) at the light exit side, and the image capturing device 15 may be disposed in the notch. Under such configuration, the first surface S1 has a height difference between the portion overlapping the image capturing device 15 and the portion not overlapping the image capturing device 15, and the height difference may be approximate to the thickness of the image capturing device 15, but not limited thereto.

The image capturing device 15 is adapted to receive the light beams (e.g. light beams B1' and B2') reflected by the object OBJ and transmitted to the image capturing device 15. For example, the image capturing device 15 may include a charge coupled device (CCD), a complementary metal-oxide semiconductor (CMOS) or other suitable kinds of image sensing components.

By providing two light transmissive layers (such as the first light transmissive layer 11 and the second light transmissive layer 12) having lower refractive indices than that of the light guide plate 10 on both sides of the light guide plate 10, most of the light beams can be transmitted through the total internal reflection in the light guide plate 10. In addition, by the design that the second light transmissive layer 12 is not overlapped with the light penetration region R2 and the third light transmissive layer 13 is overlapped with the light penetration region R2, the light beams transmitted in the light guiding plate 10 can be transmitted to the surface S13 of the third light transmissive layer 13 pressed by the object OBJ, and the light beams reflected by the object OBJ can be returned to the light guide plate 10 after passing through the third light transmissive layer 13 and then transmitted to the image capturing device 15 through total internal reflection. Therefore, stray light beams received by the image capturing device 15 can be reduced and the image capturing apparatus 1 has a good identification capability.

Specifically, as shown in FIG. 2, light beams (e.g. light beams B1 and B2) emitted from the light source 14 enter the light guide plate 10 from the first surface S1. When incident angles θ of the light beams transmitted to the interface between the light guide plate 10 and the second light transmissive layer 12 meet the conditions of total internal reflection, the light beams can be transmitted in a manner of total internal reflection toward the image capturing device 15 in the light guide plate 10. In an exemplary embodiment, $45°\leq\theta\leq80°$.

When the light beams are transmitted to the light penetration region R2 from the light transfer region R1, since the second light transmissive layer 12 having a lower refractive index than that of the light guide plate 10 is not disposed on the second surface S2 in the light penetration region R2 and the third light transmissive layer 13 having the refractive index close to that of the light guide plate 10 is disposed on the second surface S2 in the light penetration region R2, at least part of the light beams are output from the light guide plate 10 and transmitted to the surface S13, which is pressed by the object OBJ, of the third light transmissive layer 13. The light beams transmitted to the surface S13 of the third light transmissive layer 13 are reflected by the object OBJ. The reflected light beams (light beams with biometric information) pass through the opening O and enter the light guide plate 10 and then transmitted to the image capturing device 15 through total internal reflection.

The amount of light beams output from the light guide plate 10 and transmitted to the object OBJ is relevant to the size of the opening O, and the amount of light beams reflected by the object OBJ and entering the light guide plate 10 is also relevant to the size of the opening O. In the exemplary embodiment, the area of the light penetration region R2 may be defined by the area of the opening O, and the area of the light penetration region R2 may be approximated to the pressing area of the object OBJ, but not limited thereto.

According to different needs, the image capturing apparatus 1 may further include other components or layers. For example, the image capturing apparatus 1 may further include a carrier plate 16, wherein the first light transmissive layer 11 is located between the light guide plate 10 and the carrier plate 16. The carrier plate 16 may be a cover plate, a back plate or a display, but not limited thereto. In the exemplary embodiment, the carrier plate 16 is located outside transmission paths of the light beams emitted from the light source 14 and transmitted to the image capturing device 15. Therefore, the carrier plate 16 may be transparent or opaque.

When the carrier plate 16 is a display, the display may be a liquid crystal display, a quantum dot display, a display with touch electrodes or an organic light emitting display, but not limited thereto. The display has a display area R3 (shown in FIG. 1) for display images. The light guide plate 10, the first light transmissive layer 11, the second light transmissive layer 12 and the third light transmissive layer 13 are overlapped with the display area R3 in the normal direction Z. Since the light guide plate 10, the first light transmissive layer 11, the second light transmissive layer 12 and the third light transmissive layer 13 are transparent, the influence of the above layers on the images or visual effect of the image capturing apparatus 1 can be reduced.

In an exemplary embodiment, the carrier plate 16 may be overlapped with the light source 14 in the normal direction Z, a top surface (a surface facing the light guide plate 10) of the carrier plate 16 may have a notch (not shown), and the light source 14 may be disposed in the notch. The following embodiments may be modified as described above, and repetition will be omitted below.

In an exemplary embodiment, the image capturing apparatus 1 may further include a controller (not shown) to control the light source 14 and the image capturing device 15. The controller and the light source 14 may be electrically connected in a wireless or wired way. For example, the controller and the light source 14 may be electrically connected through a flexible printed circuit board (FPCB), and the FPCB and the controller can be connected by fasteners for easy maintenance, but not limited thereto. The connection between the controller and the image capturing device 15 may adopt the same way as described above, and will not repeated here.

In an exemplary embodiment, the image capturing apparatus 1 may further include at least one collimator (not shown). The collimator may include a fiber array, a grating or microstructure, but not limited thereto. For example, a collimator may be disposed between the light source 14 and the light guide plate 10 to cause the light beams emitted from the light source 14 to enter the light guide plate 10 at a specific incident angle. On the other hand, a collimator may be disposed between the image capturing device 15 and the light guide plate 10 to cause the light beams with biometric information to enter the image capturing device 15 at a specific incident angle and to reduce noise and crosstalk. In an exemplary embodiment, the light source 14 may be a light source with a narrow divergence angle, and the collimator disposed between the light source 14 and the light guide plate 10 may be omitted.

Figure 3:
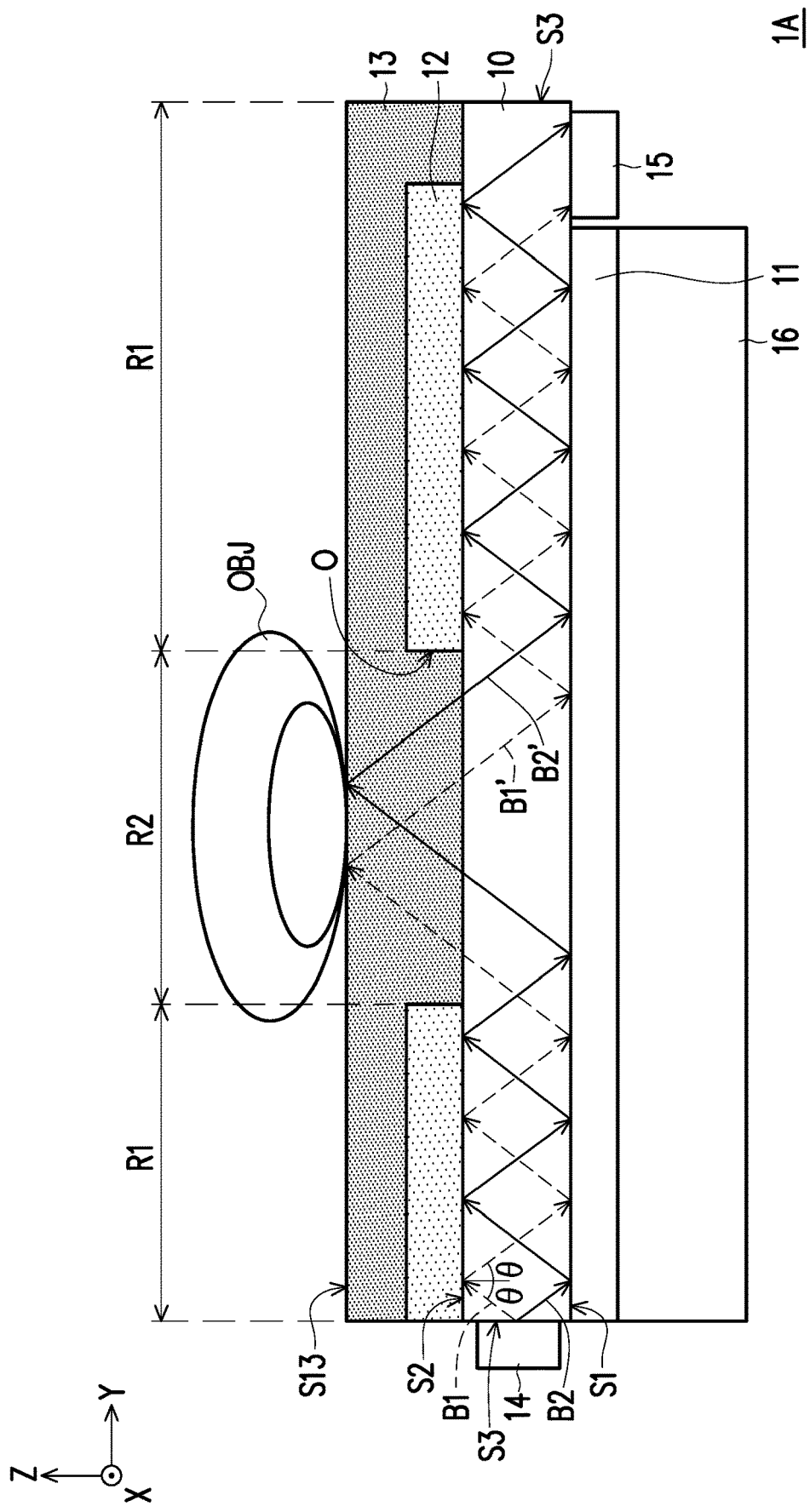
FIG. 3 to FIG. 6 are schematic partial sectional views of image capture apparatuses according to a second exemplary embodiment to a fifth exemplary embodiment of the disclosure.

FIG. 3 to FIG. 6 are schematic partial sectional views of image capture apparatuses 1A to 1D according to a second exemplary embodiment to a fifth exemplary embodiment of the disclosure. Referring to FIG. 3, the main differences between the image capturing apparatus 1A of the second exemplary embodiment and the image capturing apparatus 1 in FIG. 2 are described below. In the image capturing apparatus 1A, the light source 14 is located beside one of the third surfaces S3. For example, the light source 14 is located beside the third surfaces S3 away from the image capturing device 15.

In an exemplary embodiment, the image capturing apparatus 1A may further include at least one collimator (not shown). For example, a collimator may be disposed between the light source 14 and the light guide plate 10 to cause the light beams emitted from the light source 14 to enter the light guide plate 10 at a specific incident angle. On the other hand, a collimator may be disposed between the image capturing device 15 and the light guide plate 10 to cause the light beams with biometric information to enter the image capturing device 15 at a specific incident angle. In an exemplary embodiment, the light source 14 may be a light source with a narrow divergence angle, and the collimator disposed between the light source 14 and the light guide plate 10 may be omitted.

Figure 4:
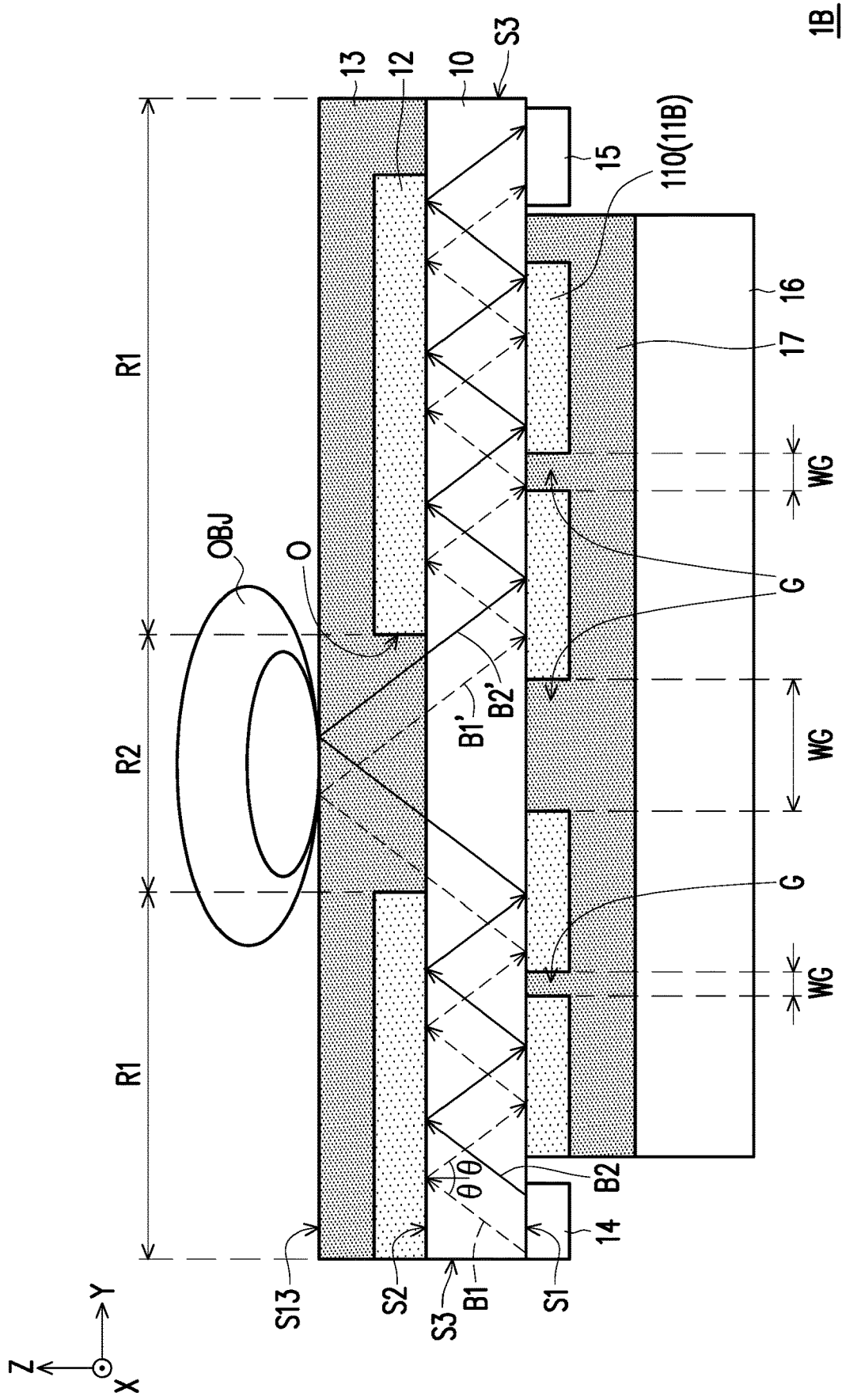

Referring to FIG. 4, the main differences between the image capturing apparatus 1B of the third exemplary embodiment and the image capturing apparatus 1 in FIG. 2 are described below. In the image capturing apparatus 1B, the first light transmissive layer 11B includes a plurality of light transmissive patterns 110 separated from each other. Moreover, the image capturing apparatus 1B further includes a fourth light transmissive layer 17 disposed on the first surface S1 and overlapped with the light transfer region R1 and the light penetration region R2 in the normal direction Z.

For example, the light transmissive patterns 110 may be strip patterns, wherein the strip patterns are arranged along a direction Y perpendicular to the normal direction Z, and the strip patterns respectively extend along the direction X, but not limited thereto. A gap G is located between any two adjacent strip patterns, and the gaps G located between the strip patterns are arranged along the direction Y and respectively extend along the direction X, but not limited thereto.

The fourth light transmissive layer 17 may be disposed on the first light transmissive layer 11B and the light guide plate 10 not covered by the first light transmissive layer 11B, so that the first light transmissive layer 11B is located between the fourth light transmissive layer 17 and the light guide plate 10, and a portion of the fourth light transmissive layer 17 is located in the gaps G, but the disposition relationship between the first light transmissive layer 11B and the fourth light transmissive layer 17 is not limited thereto.

The fourth light transmissive layer 17 is transparent, but the transmittance thereof is not limited to 100%. For example, the fourth light transmissive layer 17 may be made of acrylic, epoxy or optical clear adhesive (OCA), but not limited thereto.

The light beams in the light guide plate 10 may output from the light guide plate 10 through the first surface S1 not covered by the light transmissive patterns 110 but covered by the fourth light transmissive layer 17. Namely, the light beams in the light guide plate 10 may output from the light guide plate 10 through the first surface S1 overlapped with the gaps G in the normal direction Z. Since light beams with different angles are transmitted to different positions of the first surface S1, light beams with large angles can be filtered (output from the light guide plate 10) by adjusting the positions of the gaps G. For example, the gap G closest to the light source 14 may be designed to filter the light beams having a divergence angle of ±8°, the gap G in the middle may be designed to filter the light beams having a divergence angle of ±7° and the gap G closest to the image capturing device 15 may be designed to filter the light beams having a divergence angle of ±6°. However, the number of the gaps G and the light beams filtered by each of the gaps G may be changed according to requirement. Moreover, the amount of light beams output from the light guide plate 10 can be adjusted by adjusting the sizes of the gaps G. In an exemplary embodiment, the gaps G may have different widths WG along the direction Y, but not limited thereto.

In the exemplary embodiment, since the light beams with large angles are filtered by the gaps G, the light source 14 may be a light source with a wide divergence angle, and a collimator (not shown) disposed between the light source 14 and the light guide plate 10 may be omitted.

Figure 5:
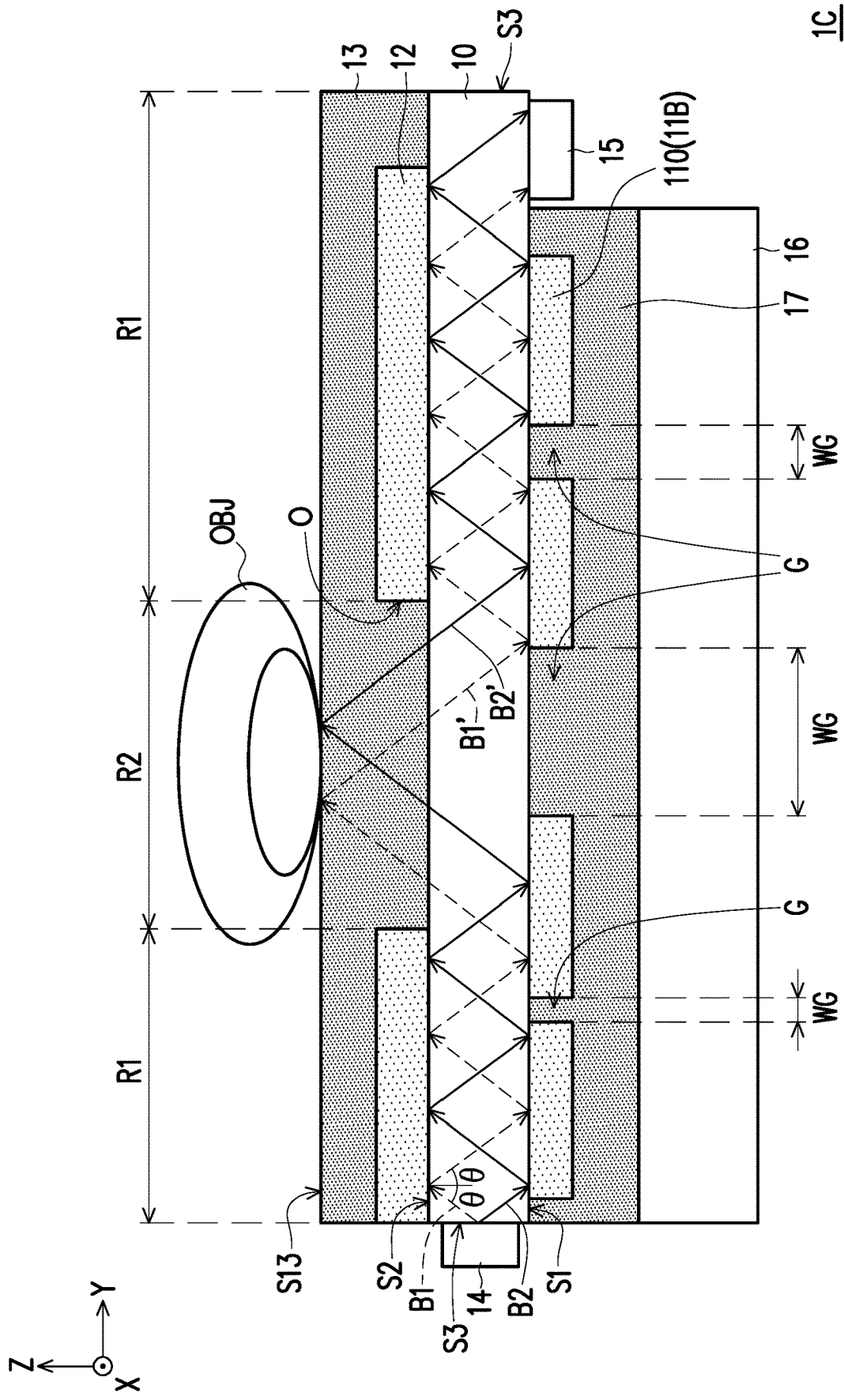

Referring to FIG. 5, the main differences between the image capturing apparatus 1C of the fourth exemplary embodiment and the image capturing apparatus 1B in FIG. 4 are described below. In the image capturing apparatus 1C, the light source 14 is located beside one of the third surfaces S3. For example, the light source 14 is located beside the third surfaces S3 away from the image capturing device 15.

In the exemplary embodiment, since the light beams with large angles are filtered by the gaps G, the light source 14 may be a light source with a wide divergence angle, and a collimator (not shown) disposed between the light source 14 and the light guide plate 10 may be omitted.

Figure 6:
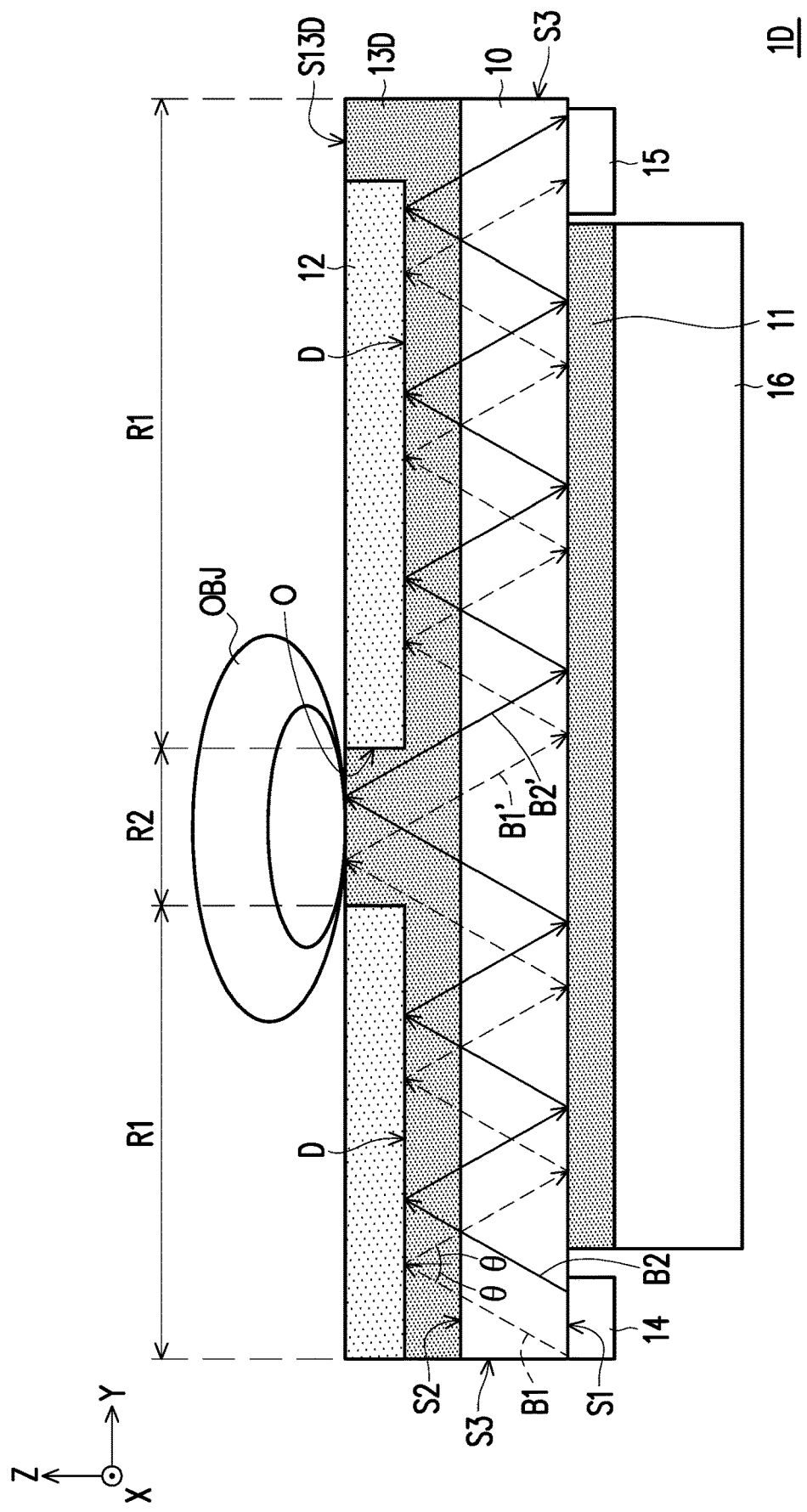

Referring to FIG. 6, the main differences between the image capturing apparatus 1D of the fifth exemplary embodiment and the image capturing apparatus 1 in FIG. 2 are described below. In the image capturing apparatus 1D, the surface S13D, which is pressed by the object OBJ, of the third light transmissive layer 13D has a depression D, and the second light transmissive layer 12 is located in the depression D, so that the third light transmissive layer 13D is located between the second light transmissive layer 12 and the light guide plate 10.

The disposition relationship between the second light transmissive layer 12 and the third light transmissive layer 13 in the second embodiment to the fourth embodiment can also be modified as described above, and the detailed description thereof is omitted here.

Figure 7:
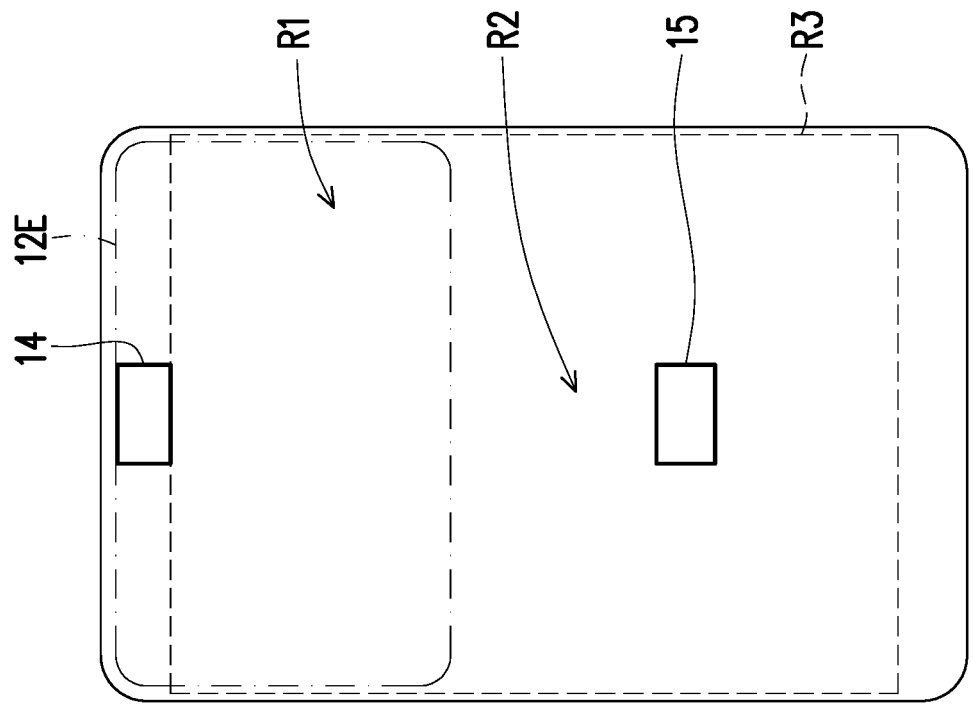
FIG. 7 is a schematic top view of an image capture apparatus according to a sixth exemplary embodiment of the disclosure.
Figure 8:
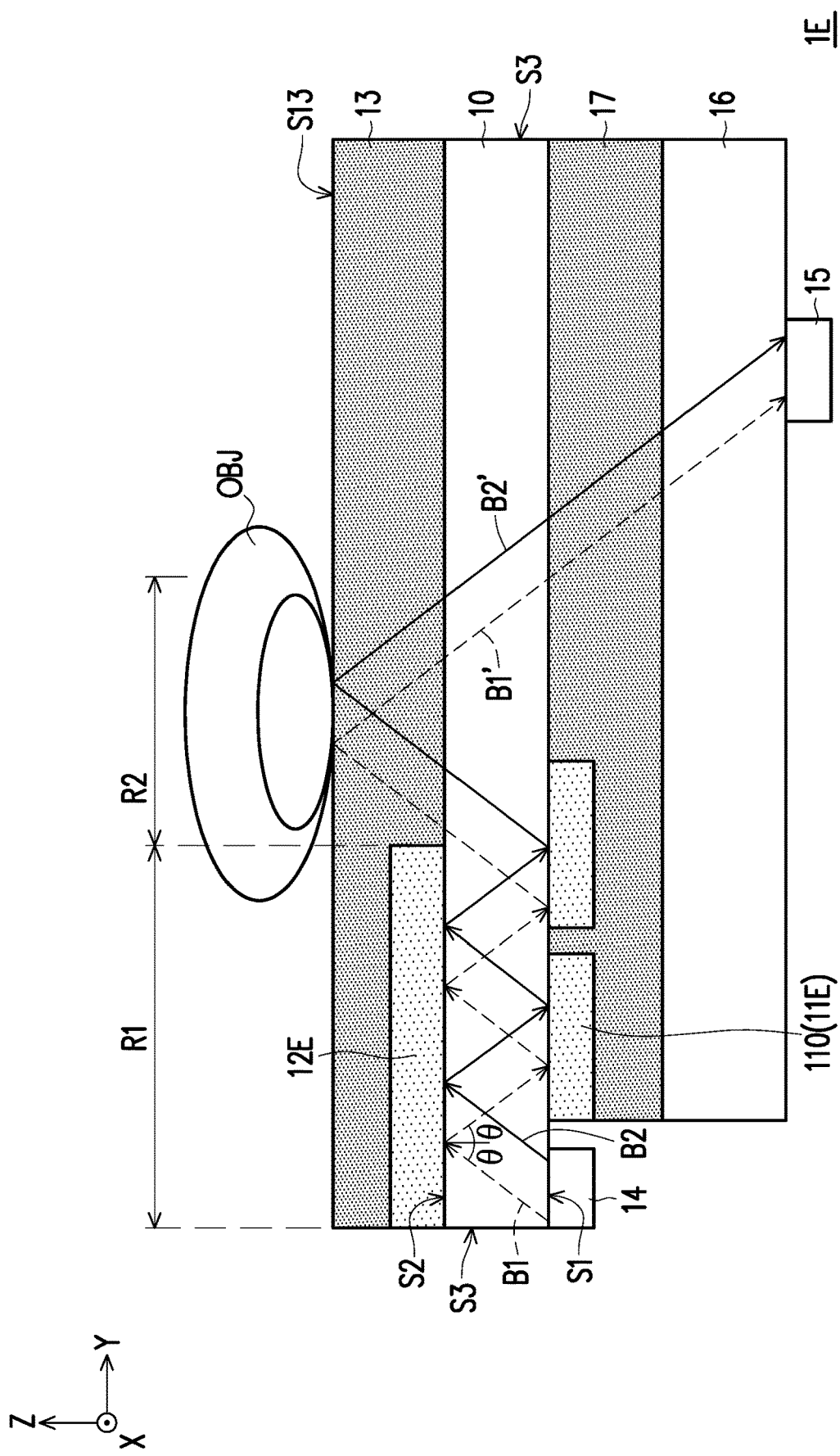
FIG. 8 is a schematic partial sectional view of the image capture apparatus according to the sixth exemplary embodiment of the disclosure.
Figure 9:
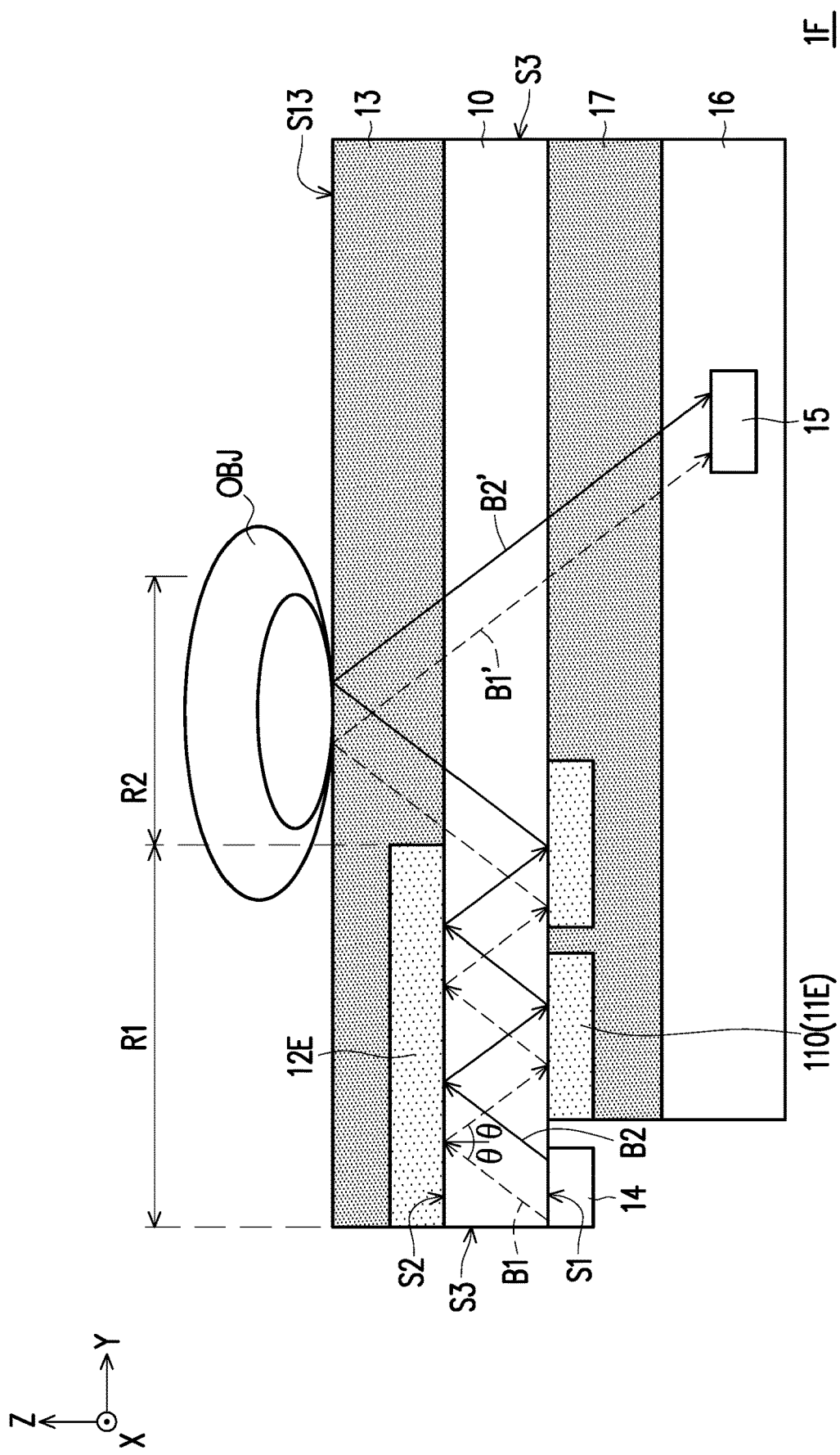
FIG. 9 is a schematic partial sectional view of an image capture apparatus according to the seventh exemplary embodiment of the disclosure.

FIG. 7 is a schematic top view of an image capture apparatus 1E according to a sixth exemplary embodiment of the disclosure. FIG. 8 is a schematic partial sectional view of the image capture apparatus 1E according to the sixth exemplary embodiment of the disclosure. FIG. 9 is a schematic partial sectional view of an image capture apparatus 1F according to the seventh exemplary embodiment of the disclosure.

Referring to FIG. 7 to FIG. 9, the main differences between the image capturing apparatus 1E of the sixth exemplary embodiment (or the image capture apparatus 1F of the seventh exemplary embodiment) and the image capturing apparatus 1B in FIG. 4 are described below. In the image capturing apparatus 1E (or the image capture apparatus 1F), the image capturing device 15 may be located below the carrier plate 16 (shown in FIG. 8) or inside the carrier plate 16 (shown in FIG. 9) to facilitate the design of the narrow frame. Under such configuration, the light beams reflected by the object OBJ is transmitted to the image capturing device 15 after sequentially passing through the third light transmissive layer 13, the light guide plate 10, the fourth light transmissive layer 17 and the carrier plate 16. To prevent the carrier plate 16 from shielding the light beams, the carrier plate 16 is preferably a transparent carrier plate, but the transmittance thereto is not limited to 100%. For example, the carrier plate 16 may be a transparent cover plate, a transparent back plate or a transparent display. In a case where the carrier plate 16 is an organic light emitting display, the image capturing device 15 may be located in the display area R3 of the organic light emitting display.

In the exemplary embodiments in FIG. 8 and FIG. 9, light beams reflected by the object OBJ can be transmitted to the image capturing device 15 without the need of total internal reflection. Therefore, the light transfer region R1 can be located at only a side of the light penetration region R2. Correspondingly, the second light transmissive layer 12E and the first light transmissive layer 11E are located in the light transfer region R1, and the second light transmissive layer 12E and the first light transmissive layer 11E need not to be provided between the light penetration region R2 and the image capturing device 15.

In an exemplary embodiment, the first light transmissive layer 11E may be a continuous transmission layer, as shown in FIG. 2. In an exemplary embodiment, the light source 14 may be located beside one of the third surfaces S3, as shown in FIG. 3. In an exemplary embodiment, the disposition relationship between the second light transmissive layer 12E and the third light transmissive layer 13 can be modified as shown in FIG. 6.

Figure 10:
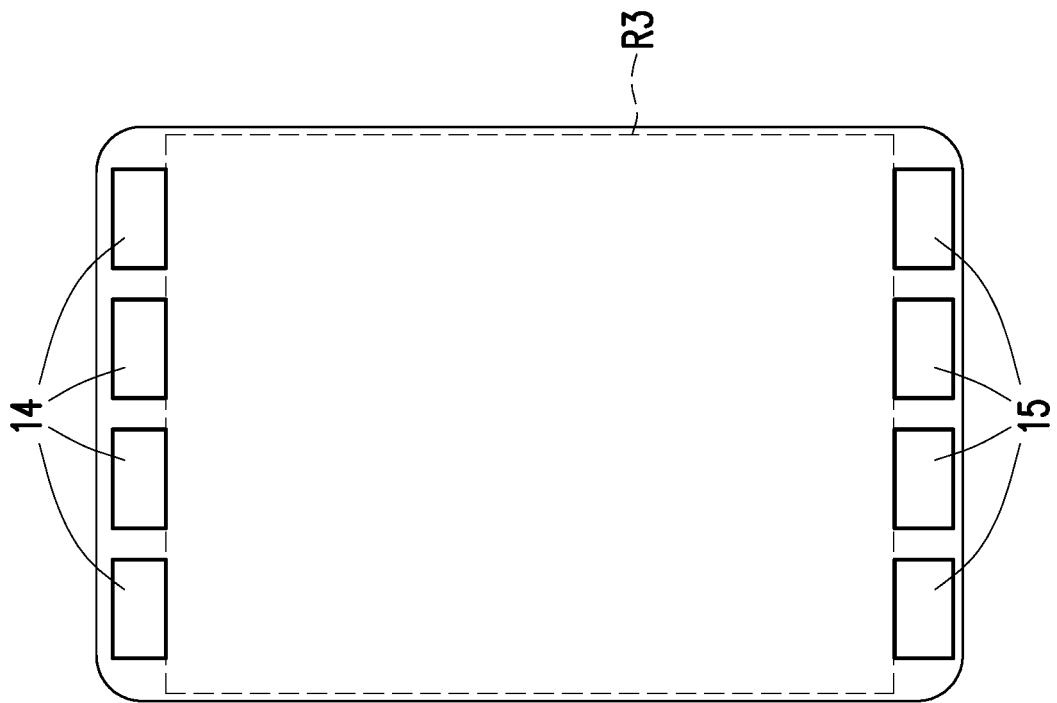
FIG. 10 is a schematic top view of an image capture apparatus according to an eighth exemplary embodiment of the disclosure.

FIG. 10 is a schematic top view of an image capture apparatus 1G according to an eighth exemplary embodiment of the disclosure. Referring to FIG. 10, the main differences between the image capturing apparatus 1G of the eighth exemplary embodiment and the image capturing apparatus 1 in FIG. 1 are described below. The image capturing apparatus 1D includes a plurality of light sources 14 and a plurality of image capturing devices 15. For example, the plurality of light sources 14 are arranged along the direction X, and the plurality of image capturing devices 15 are also arranged along the direction X. In FIG. 10, the number of the plurality of light sources 14 and the number of the plurality of image capturing devices 15 are respectively four. However, the arrangement of the plurality of light sources 14, the arrangement of the plurality of image capturing devices 15, the number of the plurality of light sources 14 and the number of the plurality of image capturing devices 15 may be changed according to needs. With the increase of the light sources 14 and the image capturing devices 15, better resolution or a larger image capture range may be obtained.

Figure 11:
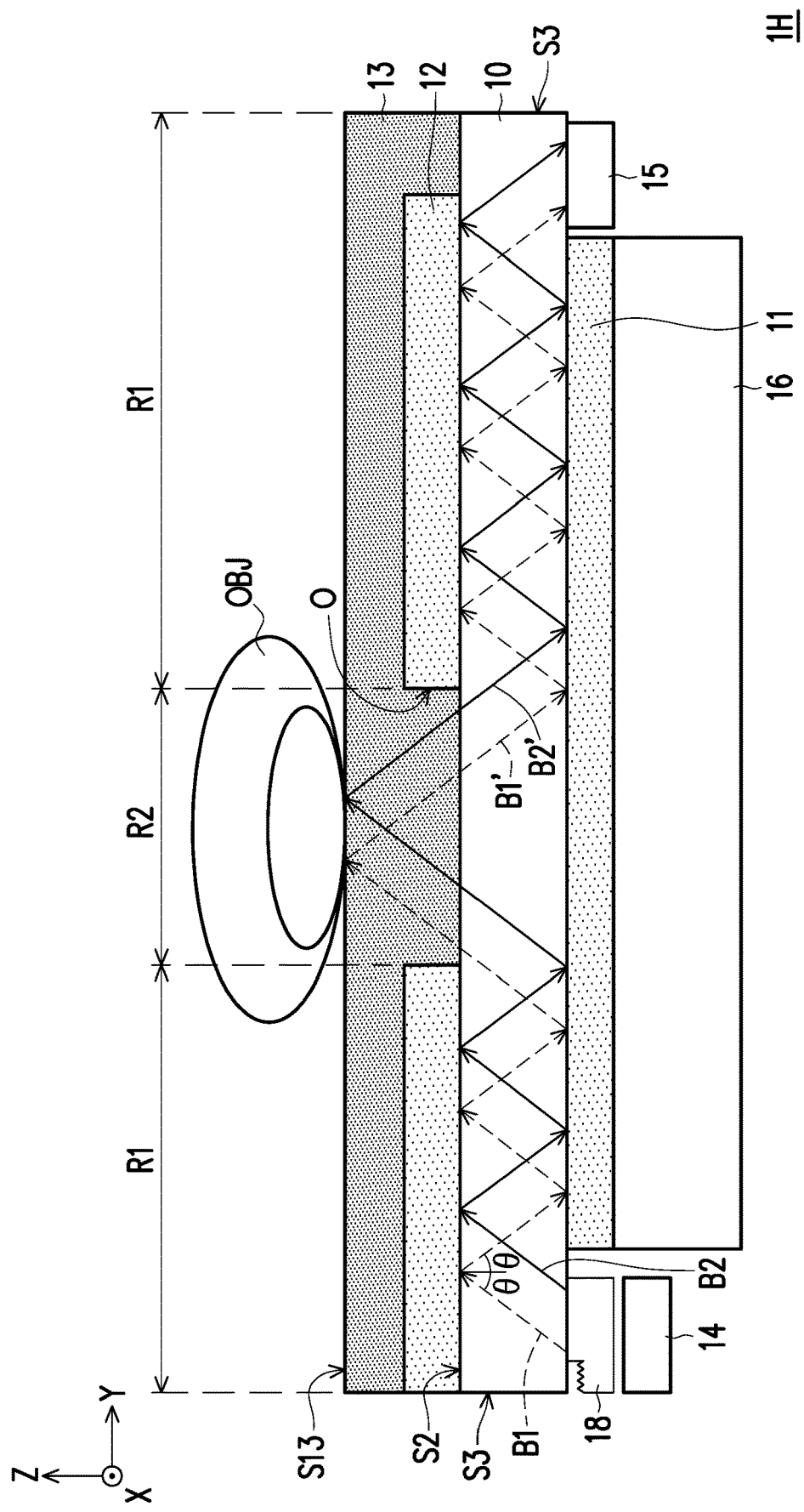
FIG. 11 is a schematic partial sectional view of an image capture apparatus according to a ninth exemplary embodiment of the disclosure.

FIG. 11 is a schematic partial sectional view of an image capture apparatus 1H according to a ninth exemplary embodiment of the disclosure. Referring to FIG. 11, the main differences between the image capturing apparatus 1H of the ninth exemplary embodiment and the image capturing apparatus 1 in FIG. 2 are described below. In the image capturing apparatus 1H, the light source 14 is located below the first surface S1, and the image capturing apparatus 1H further includes a light directing element 18 located between the light source 14 and the light guide plate 10.

The light directing element 18 is adapted to direct the light beams emitted from the light source 14 into the light guide plate 10 such that the light beams can be transmitted in the light guide plate 10 in a manner of total internal reflection. In other words, the arrangement of the light directing element 18 helps to increase the light utilization rate and the proportion of light beams received by the image capturing device 15.

Figure 12:
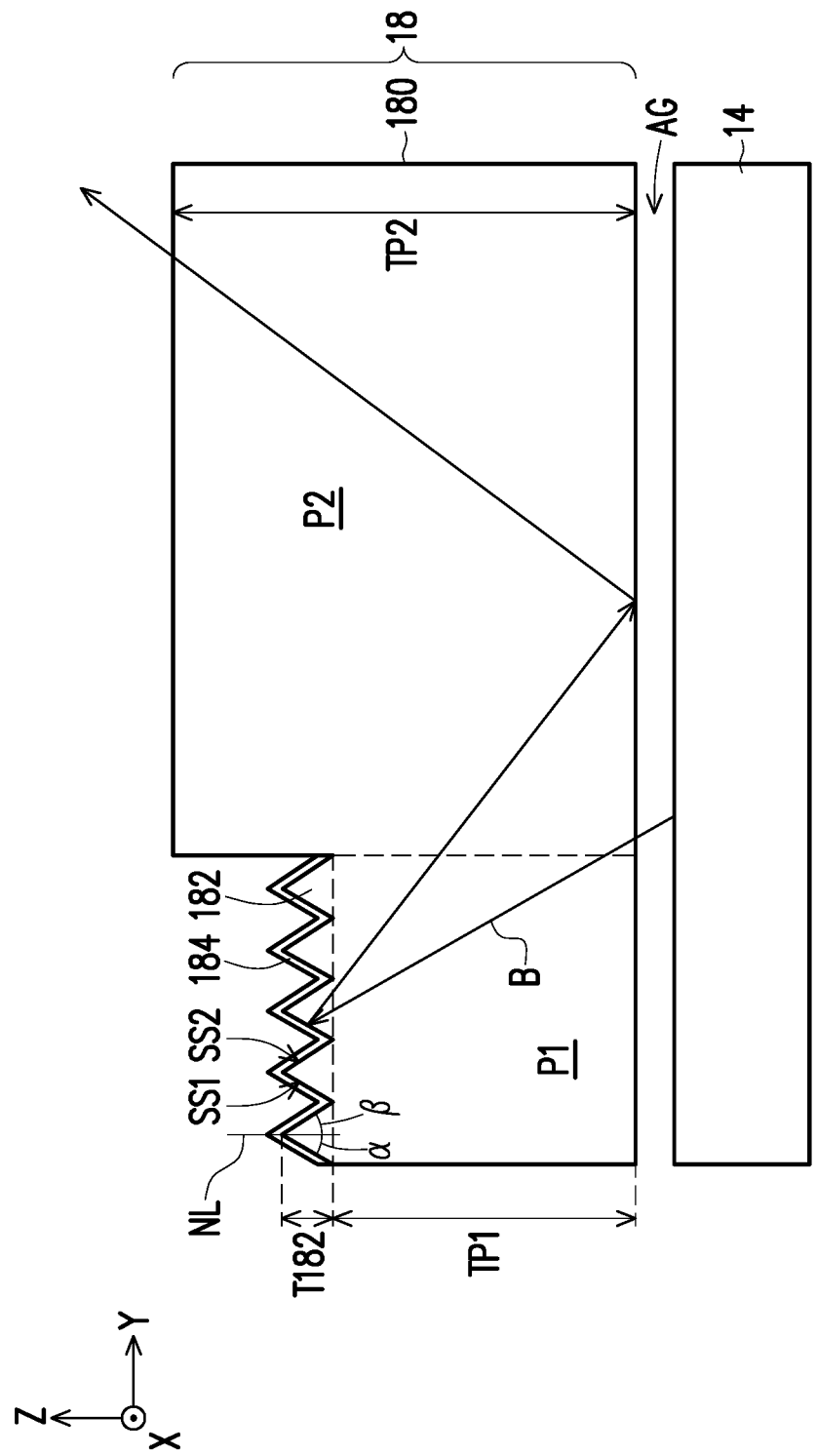
FIG. 12 is a partial enlarged view of a light directing element and a light source in FIG. 11.

FIG. 12 is a partial enlarged view of the light directing element 18 and the light source 14 in FIG. 11. Referring to FIG. 11 and FIG. 12, the light directing element 18 may include a main body 180, a plurality of microstructures 182 and an optical layer 184.

The main body 180 has a first portion P1 and a second portion P2 connected to the first portion P1 and located between the first portion P1 and the first light transmissive layer 11. The plurality of microstructures 182 are disposed on the first portion P1. A sectional shape of each of the microstructures 182 is an isosceles triangle or a non-isosceles triangle. In the case of non-isosceles triangle, the non-isosceles triangle has a first side SS1 and a second side SS2 connected to the first side SS1 and located between the first side SS1 and the second portion P2, a length of the first side SS1 may be less than or equal to a length of the second side SS2, and an angle α between the first side SS1 and a normal line NL perpendicular to the first portion P1 is less than an angle β between the second side SS2 and the normal line NL. For example, the plurality of microstructures 182 may be prisms or triangular cylinders. The triangular cylinders may be arranged along the direction Y and respectively extend along the direction X, but not limited thereto.

In the exemplary embodiment, a sum of a thickness TP1 of the first portion P1 and a thickness T182 of each of the plurality of microstructures 182 is less than or equal to a thickness TP2 of the second portion P2. Moreover, the main body 180 and the plurality of microstructures 182 may be integrally formed, but not limited thereto. The material of the main body 180 and the plurality of microstructures 182 may be plastic, but not limited thereto. The refractive indices of the main body 180 and the plurality of microstructures 182 may be 1.58 to 1.59, but not limited thereto.

The optical layer 184 is disposed on the plurality of microstructures 182. The optical layer 184 may be a reflective layer. Alternatively, the optical layer 184 may be a light transmissive layer having a refractive index that is higher than a refractive index of each of the main body 180 and the plurality of microstructures 182. With the arrangement of the optical layer 184, at least a portion of the light beams (e.g. a light beam B) transferred to the microstructures 182 can be reflected back to the second portion P2. Namely, the optical layer 184 helps to reduce the probability of the light beams passing through the plurality of microstructures 182.

In the exemplary embodiment, the light source 14 is not attached to the light directing element 18, and an air gap AG is between the light directing element 18 and the light source 14. With the existence of the air gap AG, the light beam B reflected at the interface between the microstructure 182 and the optical layer 184 and then transmitted to the interface between the main body 180 and the air gap AG may be reflected due to TIR, and the light beam may enter the light guide plate 10 and be used for biometric identification.

In any of the exemplary embodiments in which the light source 14 is located below the first surface S1, the light directing element 18 may be further included, and a collimator (not shown) disposed between the light source 14 and the light guide plate 10 may be omitted.

Figure 13:
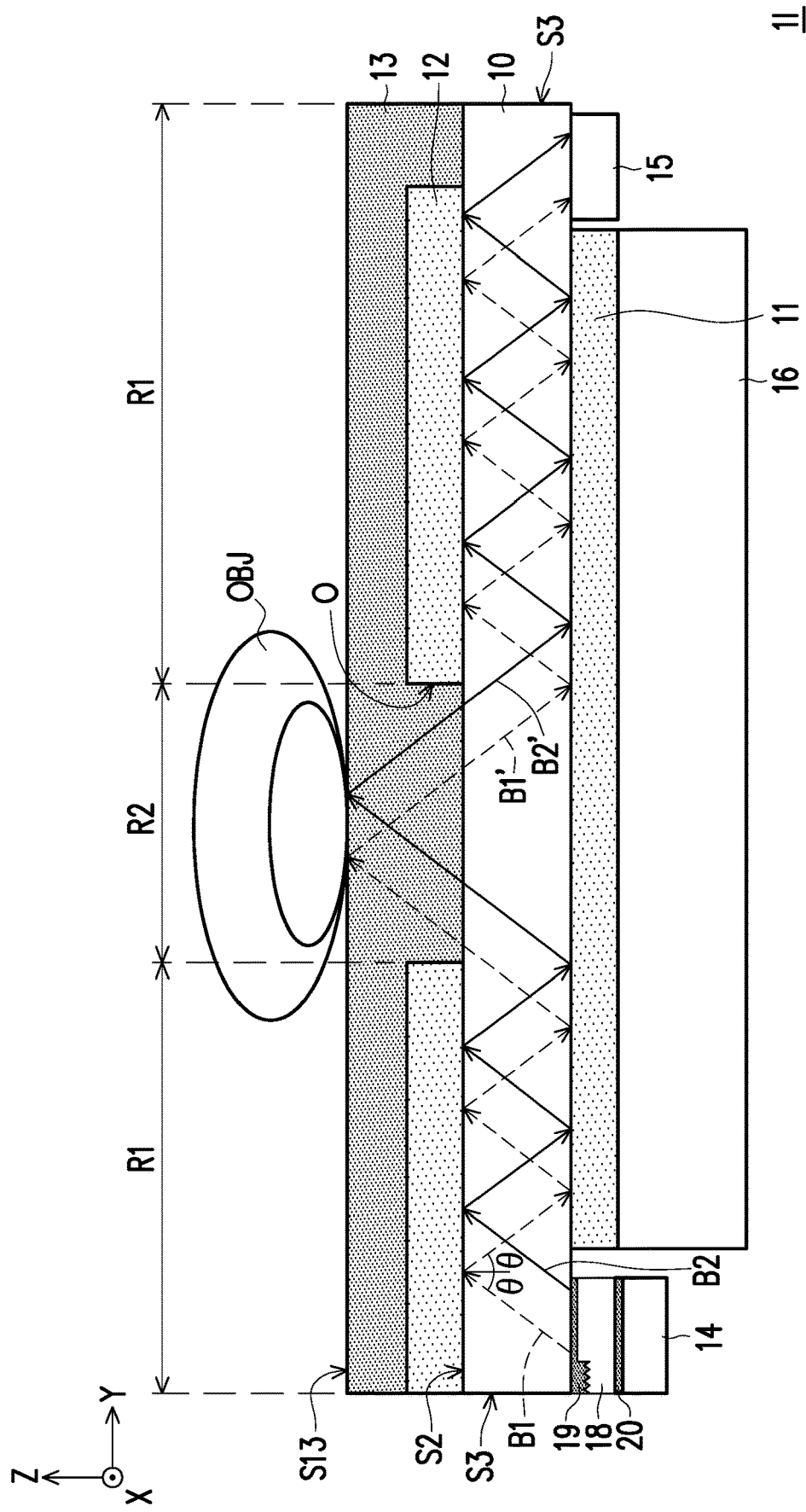
FIG. 13 is a schematic partial sectional view of an image capture apparatus according to a tenth exemplary embodiment of the disclosure.

FIG. 13 is a schematic partial sectional view of an image capture apparatus 1I according to a tenth exemplary embodiment of the disclosure. Referring to FIG. 13, the main differences between the image capturing apparatus 1I of the tenth exemplary embodiment and the image capturing apparatus 1H in FIG. 11 are described below.

The image capturing apparatus 1I further includes a first adhesive layer 19. The light directing element 18 is adhere to the first surface S1 through the first adhesive layer 19. In the exemplary embodiment, the first adhesive layer 19 is overlapped with the optical layer 184 (shown in FIG. 12) and the second portion P2 in the normal direction Z, but not limited thereto. In an exemplary embodiment, the first adhesive layer 19 may be overlapped with the second portion P2 in the normal direction Z but not overlapped with the optical layer 184 (shown in FIG. 12) in the normal direction Z.

The first adhesive layer 19 is designed to allow light beams to pass through and to avoid formation of TIR at the interface between the first adhesive layer 19 and the second portion P2. In the case where the first adhesive layer 19 is overlapped with the second portion P2 in the normal direction Z but not overlapped with the optical layer 184 (shown in FIG. 12) in the normal direction Z, the refractive index of the first adhesive layer 19 may be higher than or slightly smaller than the refractive index of each of the main body 180 and the plurality of microstructures 182. In the case where the first adhesive layer 19 is overlapped with the optical layer 184 (shown in FIG. 12) and the second portion P2 in the normal direction Z, the optical layer 184 may be a light transmissive layer having a refractive index that is higher than a refractive index of the first adhesive layer 19; alternatively, the optical layer 184 may be a reflective layer.

The image capturing apparatus 1I may further include a second adhesive layer 20. The light source 14 may be adhere to the light directing element 18 through the second adhesive layer 20. A refractive index of the second adhesive layer 20 may be less than the refractive index of each of the main body 180 and the plurality of microstructures 182 (shown in FIG. 12) so that the light beam B reflected at the interface between the microstructure 182 and the optical layer 184 and then transmitted to the interface between the main body 180 and the air gap AG may be reflected due to TIR, and the light beam may enter the light guide plate 10 and be used for biometric identification.

In any of the exemplary embodiments in which the light source 14 is located below the first surface S1, the light directing element 18 and at least one of the first adhesive layer 19 and the second adhesive layer 20 may be further included, and a collimator (not shown) disposed between the light source 14 and the light guide plate 10 may be omitted.

Figure 14:
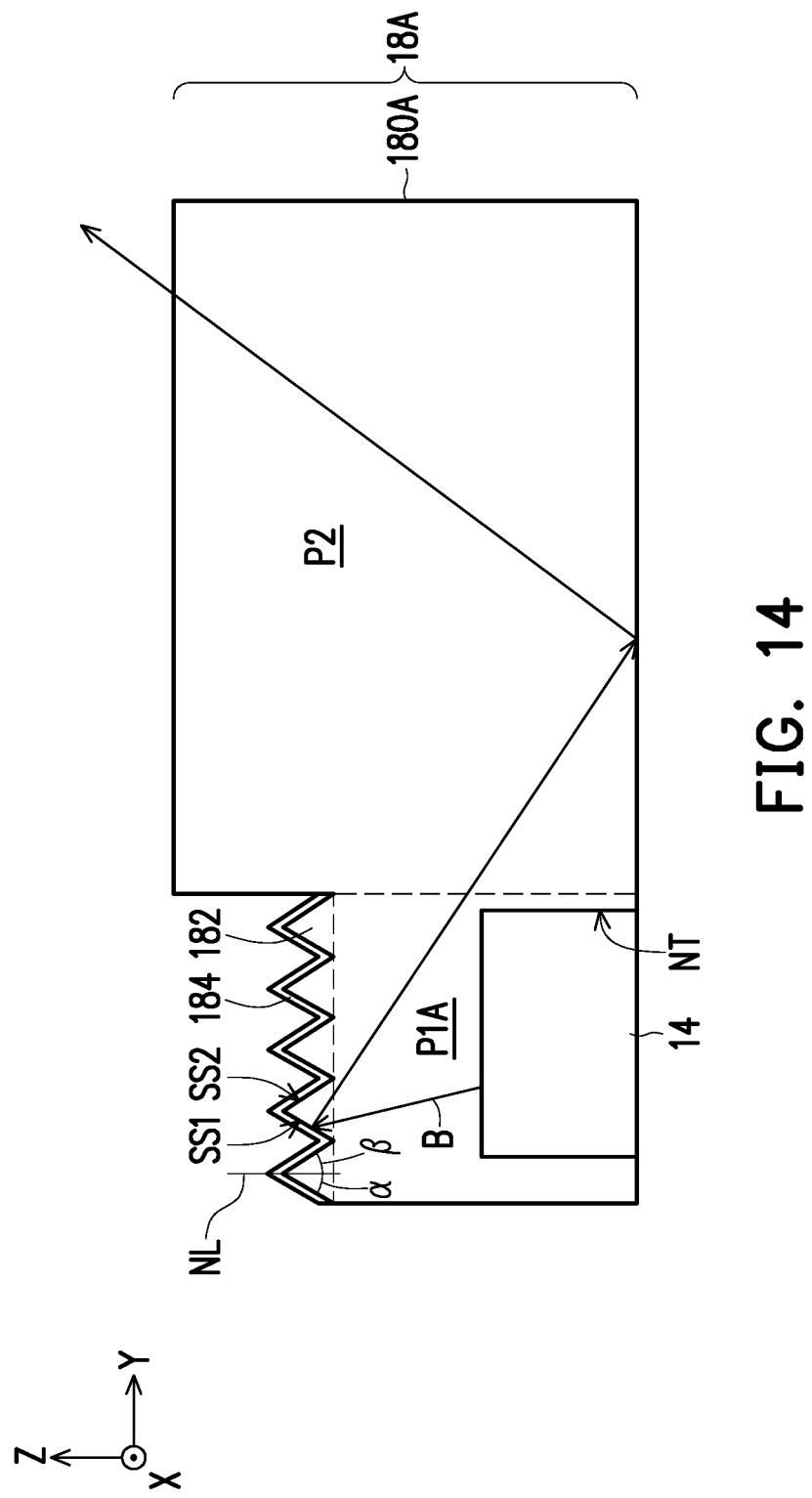
FIG. 14 is a schematic partial sectional view of a light directing element and a light source according to an exemplary embodiment of the disclosure.

FIG. 14 is a schematic partial sectional view of a light directing element 18A and the light source 14 according to an exemplary embodiment of the disclosure. Referring to FIG. 14, the main differences between the light directing element 18A and the light directing element 18 in FIG. 12 are described below. The main body 180A has a notch NT at least partially overlapped with the plurality of microstructures 182, and the light source 14 is located in the notch NT. With the design that the notch NT is at least partially overlapped with the plurality of microstructures 182, it can be avoided that the transmission paths of the light beams transmitted to the second portion P2 being affected by the notch NT or the light source 14 located in the notch NT.

In the exemplary embodiment, the notch NT is only located in the first portion P1 of the main body 180A. However, the notch NT may be located in both of the first portion P1 and the second portion P2.

In any of the exemplary embodiments in which the light source 14 is located below the first surface S1, the light directing element 18A may be further included, and the disposition relationship between the light directing element 18A and the light source 14 may be modified as described above. Moreover, at least one of the first adhesive layer 19 and the second adhesive layer 20 in FIG. 13 may be further included.

Figure 15:
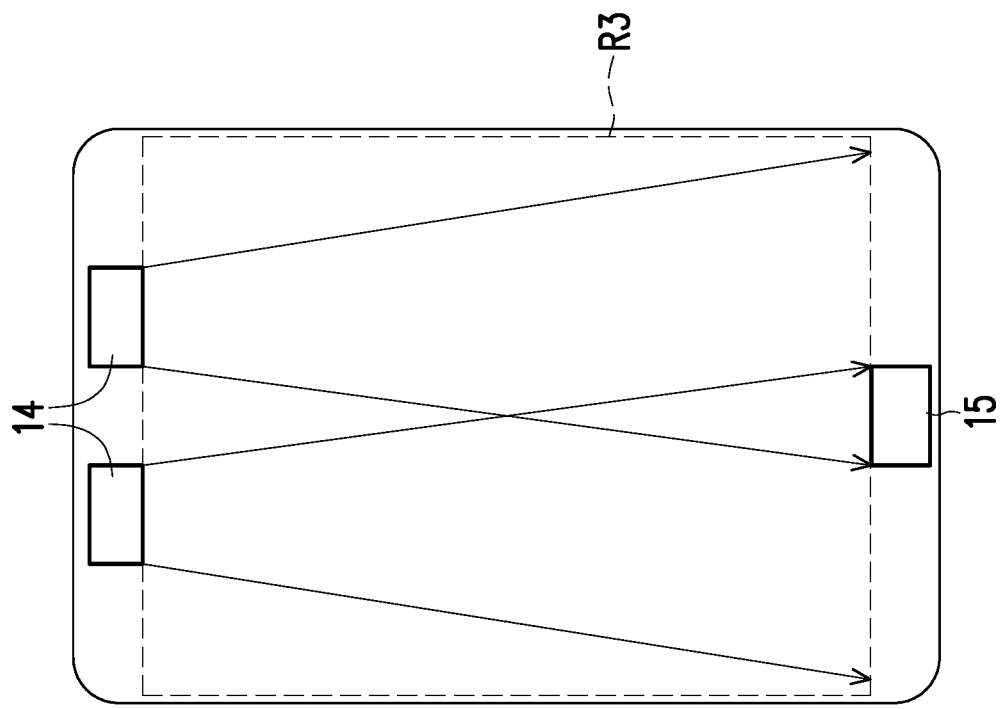
FIG. 15 is a schematic top view of an image capture apparatus according to an eleventh exemplary embodiment of the disclosure.
Figure 15:
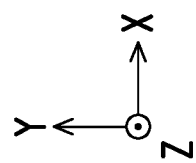

FIG. 15 is a schematic top view of an image capture apparatus 1J according to an eleventh exemplary embodiment of the disclosure. Referring to FIG. 15, the main differences between the image capturing apparatus 1J of the eleventh exemplary embodiment and the image capturing apparatus 1 in FIG. 1 are described below. The image capturing apparatus 1J includes two light sources 14 and one image capturing device 15. The two light sources 14 may emit light beams with different wavelengths or different angles of incidence (TIR angle). Moreover, the two light sources 14 may emit light beams at different times to avoid crosstalk. The images captured by the image capturing device 15 at different times may be combined to form an image that is bigger than each of the images captured at different times. As such, the image capture apparatus 1J may have better resolution or a larger image capture range.

Figure 16:
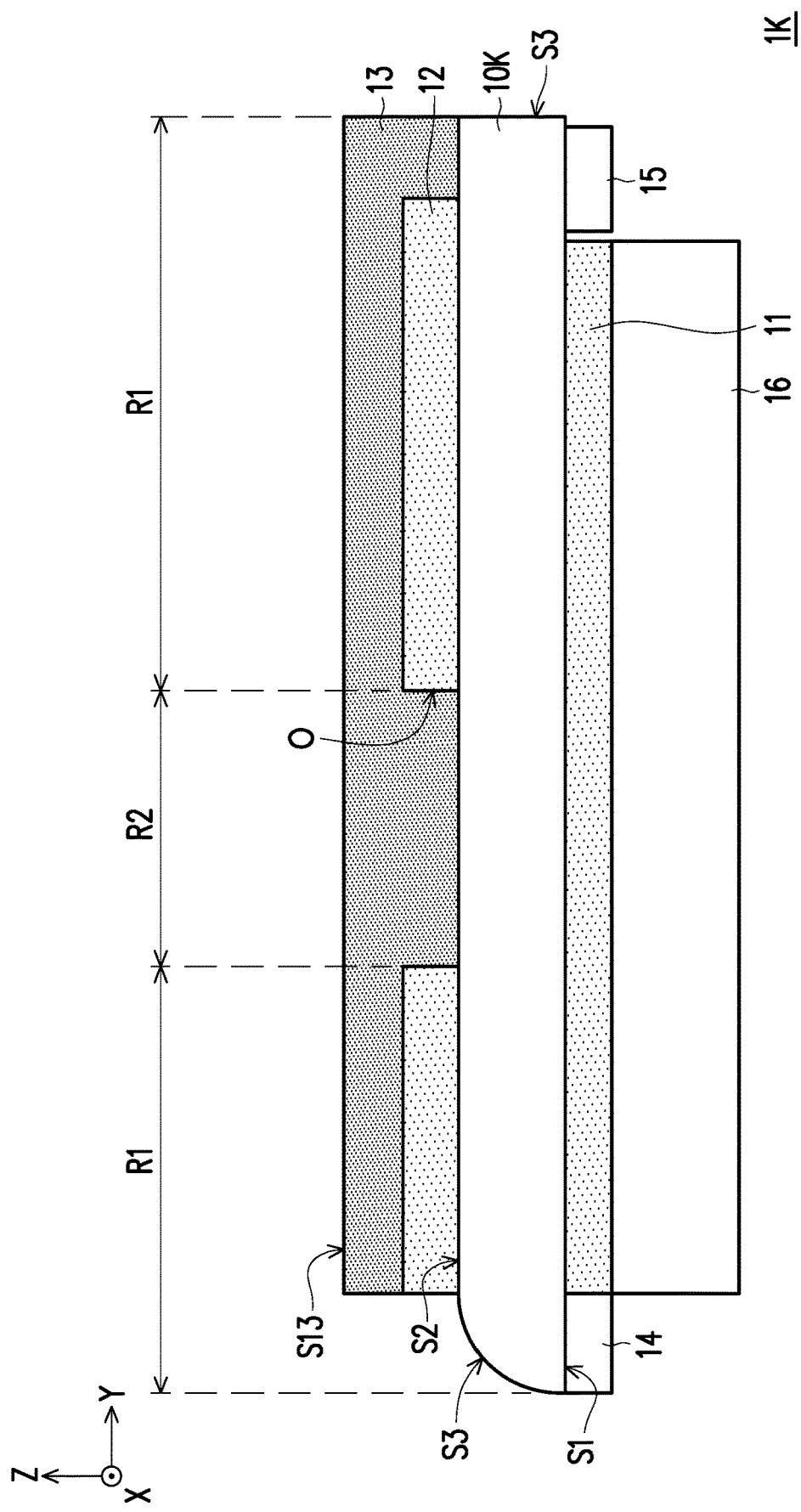
FIG. 16 is a schematic top view of an image capture apparatus according to a twelfth exemplary embodiment of the disclosure.

FIG. 16 is a schematic top view of an image capture apparatus 1K according to a twelfth exemplary embodiment of the disclosure. Referring to FIG. 16, the main differences between the image capturing apparatus 1K of the twelfth exemplary embodiment and the image capturing apparatus 1 in FIG. 2 are described below. The third surface S3 located on the light source 14 is a curved surface connected between the first surface S1 and the second surface S2, so as to reflect the light from the light source 14 to the light penetration region R2. Therefore, a light directing element (e.g. the light directing element 18 described above) may be omitted. In another exemplary embodiment, the third surface S3 located on the light source 14 may also be an inclined surface connected between the first surface S1 and the second surface S2. In other embodiments, a reflective layer (not shown) may be formed on the third surface S3. The material of the reflective layer may include metal, alloy, metal oxide, metal nitride, metal oxynitride, polymer, combination of at least two of the above, or other materials capable of reflecting light. A method for forming the reflective layer on the third surface S3 may include coating, printing, or the like. In any of the exemplary embodiments in which the light source 14 is located below the first surface S1, the third surface S3 located on the light source 14 may be modified as described above.

In view of the foregoing, by providing two light transmissive layers (such as the first light transmissive layer and the second light transmissive layer) having lower refractive indices on both sides of the light guide plate, most of the light beams can be transmitted through total internal reflection in the light guide plate. In addition, by the design that the second light transmissive layer is not overlapped with the light penetration region and the third light transmissive layer is overlapped with the light penetration region, the light beams transmitted in the light guiding plate can be transmitted to the surface of the third light transmissive layer pressed by the object, and the light beams reflected by the object can be returned to the light guide plate after passing through the third light transmissive layer and then transmitted to the image capturing device through total internal reflection. Therefore, stray light beams received by the image capturing device can be reduced and the image capturing apparatus has a good identification capability.

In an exemplary embodiment, the first light transmissive layer may include a plurality of light transmissive patterns separated from each other to filter large angle light beams. In an exemplary embodiment, the image capturing device may be located below the carrier plate or inside the carrier plate 16 to facilitate the design of the narrow frame. In an exemplary embodiment, the number of at least one of the light source and the image capturing device may be increased to obtain better resolution or a larger image capture range. In an exemplary embodiment, a light directing element may be further included to increase the light utilization rate and the proportion of light beams received by the image capturing device. In an exemplary embodiment, at least one adhesive layer may be disposed between the light directing element and the light guide plate or between the light directing element and the light source, and the refractive index of the at least one adhesive layer may be designed to avoid interface reflection. In an exemplary embodiment, the light source may be located in the notch of the main body, and the notch is at least partially overlapped with the plurality of microstructures to avoid affecting the transmission paths of the light beams. In an exemplary embodiment, the third surface located on the light source may also be a curved surface or an inclined surface to reflect the light from the light source to the light penetration region; therefore, a light directing element may be omitted.

Although the disclosure has been described with reference to the above exemplary embodiments, it will be apparent to one of ordinary skill in the art that modifications to the described exemplary embodiments may be made without departing from the spirit of the disclosure. Accordingly, the scope of the disclosure is defined by the attached claims not by the above detailed descriptions.

What is claimed is:
1. An image capturing apparatus comprising:
a light guide plate having a first surface, a second surface opposite to the first surface and a plurality of third surfaces each connecting the first surface to the second surface;
a first light transmissive layer disposed on the first surface;
a second light transmissive layer disposed on the second surface, wherein the second light transmissive layer is overlapped with a light transfer region of the light guide plate in a normal direction of the light guide plate, and the second light transmissive layer is not overlapped with a light penetration region of the light guide plate in the normal direction;

a third light transmissive layer disposed on the second surface and overlapped with the light transfer region and the light penetration region in the normal direction, wherein a refractive index of the third light transmissive layer is higher than a refractive index of the first light transmissive layer and a refractive index of the second light transmissive layer, and a refractive index of the light guide plate is higher than the refractive index of the first light transmissive layer and the refractive index of the second light transmissive layer;

a light source located below the first surface or beside one of the third surfaces; and an image capturing device located below the first surface.

2. The image capturing apparatus according to claim 1, wherein the refractive index of the first light transmissive layer is larger than 1 and smaller than or equal to 1.45, the refractive index of the second light transmissive layer is larger than 1 and smaller than or equal to 1.45, and the refractive index of the third light transmissive layer is larger than or equal to 1.5.

3. The image capturing apparatus according to claim 1, wherein a refractive index difference between the light guide plate and the third light transmissive layer is smaller than 0.1.

4. The image capturing apparatus according to claim 1, wherein a refractive index difference between the light guide plate and the first light transmissive layer is larger than 0.05, and a refractive index difference between the light guide plate and the second light transmissive layer is larger than 0.05.

5. The image capturing apparatus according to claim 1, wherein the second light transmissive layer has an opening overlapped with the light penetration region of the light guide plate in the normal direction.

6. The image capturing apparatus according to claim 1, wherein the first light transmissive layer comprises a plurality of light transmissive patterns separated from each other, and the image capturing apparatus further comprising:

a fourth light transmissive layer disposed on the first surface and overlapped with the light transfer region and the light penetration region in the normal direction.

7. The image capturing apparatus according to claim 1 further comprising:

a carrier plate, wherein the first light transmissive layer is located between the light guide plate and the carrier plate, and the carrier plate is a cover plate, a back plate or a display.

8. The image capturing apparatus according to claim 7, wherein the image capturing device is located below the carrier plate or inside the carrier plate, and the carrier plate is a transparent carrier plate.

9. The image capturing apparatus according to claim 8, wherein the carrier plate is an organic light emitting display, and the image capturing device is located in a display area of the organic light emitting display.

10. The image capturing apparatus according to claim 1, wherein the light source is located below the first surface, and the image capturing apparatus further comprising:

a light directing element located between the light source and the light guide plate.

11. The image capturing apparatus according to claim 10, wherein the light directing element comprises:

a main body having a first portion and a second portion connected to the first portion and located between the first portion and the first light transmissive layer;

a plurality of microstructures disposed on the first portion; and an optical layer disposed on the plurality of microstructures.

12. The image capturing apparatus according to claim 11, wherein the optical layer is a reflective layer, or the optical layer is a light transmissive layer having a refractive index that is higher than a refractive index of each of the main body and the plurality of microstructures.

13. The image capturing apparatus according to claim 11, wherein a sum of a thickness of the first portion and a thickness of each of the plurality of microstructures is less than or equal to a thickness of the second portion.

14. The image capturing apparatus according to claim 11, wherein the main body and the plurality of microstructures are integrally formed.

15. The image capturing apparatus according to claim 11, wherein a sectional shape of each of the microstructures is an isosceles triangle or a non-isosceles triangle.

16. The image capturing apparatus according to claim 15, wherein the sectional shape of each of the microstructures is a non-isosceles triangle, the non-isosceles triangle has a first side and a second side connected to the first side and located between the first side and the second portion, a length of the first side is less than or equal to a length of the second side, and an angle between the first side and a normal line perpendicular to the first portion is less than an angle between the second side and the normal line.

17. The image capturing apparatus according to claim 11 further comprising:

a first adhesive layer, wherein the light directing element is adhere to the first surface through the first adhesive layer, the first adhesive layer is overlapped with the optical layer and the second portion in the normal direction, and wherein the optical layer is a reflective layer, or the optical layer is a light transmissive layer having a refractive index that is higher than a refractive index of the first adhesive layer.

18. The image capturing apparatus according to claim 11, wherein an air gap is between the light directing element and the light source.

19. The image capturing apparatus according to claim 11 further comprising:

a second adhesive layer, wherein the light source is adhere to the light directing element through the second adhesive layer, and a refractive index of the second adhesive layer is less than a refractive index of each of the main body and the plurality of microstructures.

20. The image capturing apparatus according to claim 11, wherein the main body has a notch at least partially overlapped with the plurality of microstructures, and the light source is located in the notch.

21. The image capturing apparatus according to claim 1, wherein the third surface located on the light source is a curved surface or an inclined surface.

* * * * *